(12) United States Patent
Park

(10) Patent No.: US 6,998,302 B2
(45) Date of Patent: Feb. 14, 2006

(54) METHOD OF MANUFACTURING MOSFET HAVING A FINE GATE WIDTH WITH IMPROVEMENT OF SHORT CHANNEL EFFECT

(75) Inventor: Cheolsoo Park, Seoul (KR)

(73) Assignee: Dongbu Anam Semiconductor, Inc., Seoul (KR)

( * ) Notice: Subject to any disclaimer, the term of this patent is extended or adjusted under 35 U.S.C. 154(b) by 0 days.

(21) Appl. No.: 10/748,466

(22) Filed: Dec. 30, 2003

(65) Prior Publication Data

US 2004/0152248 A1 Aug. 5, 2004

(30) Foreign Application Priority Data

Dec. 30, 2002 (KR) .................. 10-2002-0086404

(51) Int. Cl.
*H01L 21/8234* (2006.01)
(52) U.S. Cl. ................ 438/197; 438/304; 438/595
(58) Field of Classification Search ........... 438/954, 438/197, 216, 217, 267, 287, 300, 304, 596
See application file for complete search history.

(56) References Cited

U.S. PATENT DOCUMENTS

| | | | |
|---|---|---|---|
| 6,346,467 B1 | 2/2002 | Chang et al. | |
| 6,727,151 B2 * | 4/2004 | Chong et al. | ........ 438/300 |
| 2002/0001935 A1 | 1/2002 | Kim et al. | |
| 2003/0151098 A1 * | 8/2003 | Nishida et al. | ........ 257/369 |

* cited by examiner

*Primary Examiner*—Jack Chen
(74) *Attorney, Agent, or Firm*—Hanley, Flight & Zimmerman, LLC

(57) ABSTRACT

A method for fabricating a transistor in a semiconductor device is disclosed. An example method forms an isolation region in a semiconductor substrate and sequentially deposits a pad oxide layer, a pad nitride layer and a first oxide layer on the substrate and the isolation region. The example method also patterns the first oxide layer and pad nitride layer to form a gate electrode, deposits a doped poly silicon layer, forms a doped polysilicon sidewall on the pad nitride layer and the first oxide layer, etches the pad oxide layer, sequentially deposits and planarizing a gate isolation layer, a gate nitride layer and a metal layer on the substrate to form the gate electrode. In addition, the example method forms a source, a drain, a gate plug, a source plug and a drain plug, respectively.

6 Claims, 2 Drawing Sheets

METHOD OF MANUFACTURING MOSFET HAVING A FINE GATE WIDTH WITH IMPROVEMENT OF SHORT CHANNEL EFFECT

FIELD OF THE DISCLOSURE

The present disclosure relates generally to semiconductor devices and, more particularly, to a method for manufacturing a fine transistor having a size less than 0.10 µm.

BACKGROUND

In general, as a semiconductor device becomes highly integrated, approaches for realizing a nano-technology in a manufacturing of the semiconductor device have been developed. However, a tool or a material of lithography using, particularly, a deep ultraviolet (DUV) equipment, is recently insufficient in view of a mass production and thus a size of a diameter of a wafer is enlarged. In addition, the purchase cost of the tool and a process costs are excessively increased.

For example, U.S. Pat. No. 6,346,467 discloses a method of making tungsten gate MOS transistor and memory cell by encapsulation and U.S. Patent Application Publication No. US2002/0001935 A1 discloses a method of forming a gate electrode in a semiconductor device which can prevent transformation of the gate electrode.

However, in such examples, when a fine transistor having a size of not greater than 0.10 µm is manufactured, there are limitations and drawbacks in forming a gate electrode having a small critical dimension. Particularly, as the critical dimension of the gate electrode is reduced, a short channel effect, in which a threshold voltage becomes small due to a shorter length between a source channel and a drain channel, occurs.

DETAILED DESCRIPTION

As described in greater detail below, a fine transistor having a size of not greater than 0.10 µm is fabricated by forming a doped poly silicon layer for controlling a length of a gate channel in a formation of a gate and reducing a cost of a lithography tool. In one example, a method for fabricating a transistor in a semiconductor device forms an isolation region in a semiconductor substrate and sequentially deposits a pad oxide layer, a pad nitride layer and a first oxide layer on the substrate and the isolation region. The example method also patterns the first oxide layer and pad nitride layer to form a gate electrode, deposits a doped poly silicon layer, and forms a doped polysilicon sidewall on the pad nitride layer and first oxide layer. In addition, the example method etches the pad oxide layer, sequentially deposits and planarizes a gate isolation layer, a gate nitride layer and a metal layer on the substrate to thereby form the gate electrode, and forms a source, a drain, a gate plug, a source plug and a drain plug, respectively.

Figure 1A:
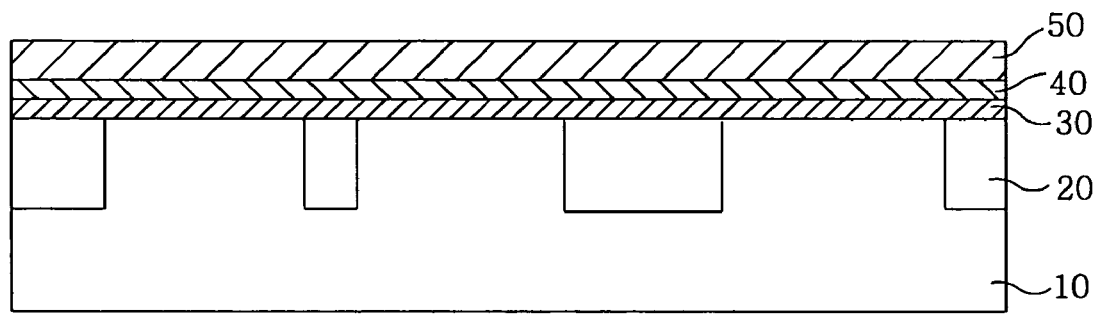
FIGS. 1A to 1D represent an example process for manufacturing a fine transistor.

FIGS. 1A to 1D represent an example procedure for manufacturing a fine transistor. Referring to FIG. 1A, a shallow trench isolation (STI) 20 is formed in a silicon substrate 10. A pad oxide layer 30, a pad nitride layer 40 and a first oxide layer 50 are sequentially deposited on the substrate 10. A thickness of the first oxide layer 50 is about equal to that of a gate electrode to be formed later.

Figure 1B:
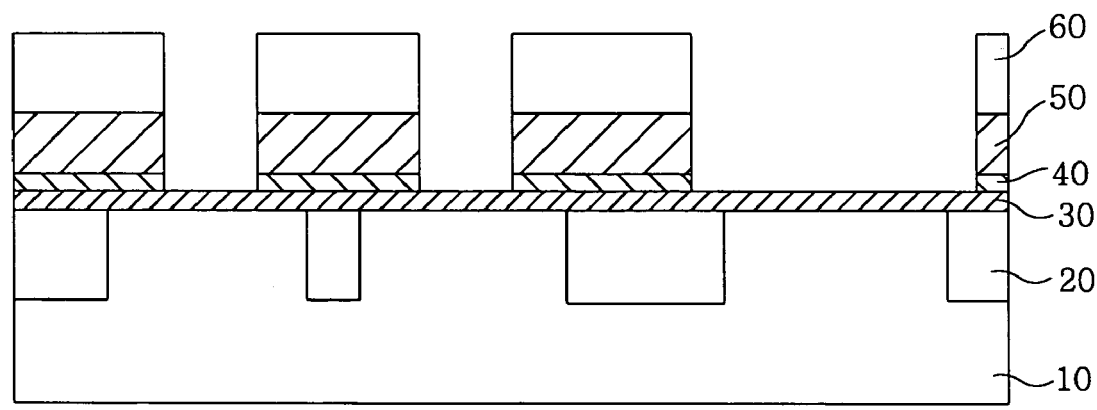

Referring to FIG. 1B, a photoresist 60 on the first oxide 50 is patterned in order to be used in forming the gate electrode. Next, the first oxide layer 50 and the pad nitride layer 40 are sequentially dry etched. The pad oxide layer 30 has a thickness of at least 50 angstrom.

Figure 1C:
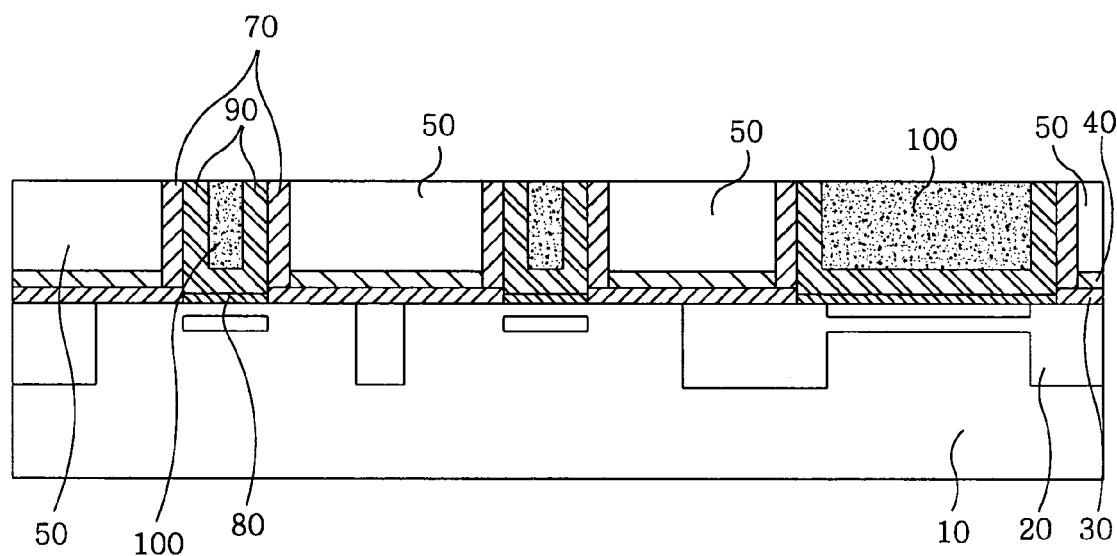

Referring to FIG. 1C, a cleaning is performed after removing the photoresist 60. Next, a doped poly silicon layer is deposited all over the pad oxide layer 30, the pad nitride layer 40 and the first oxide layer 50, and the doped poly silicon layer is etched back to expose the pad oxide layer 30 to thereby form a doped poly silicon sidewall 70 on a sidewall of the pad nitride layer 40 and the first oxide layer 50.

Next, the pad oxide layer 30 exposed by the doped poly silicon sidewall 70 is removed using a precleaning method to expose the silicon substrate 10, and then a gate isolation layer 80 is formed on the silicon substrate 10. The thickness of the gate isolation layer 80 is preferably smaller than that of the pad oxide layer 30. A gate nitride layer 90 of, e.g., TiN or TaN, is deposited by a chemical vapor deposition (CVD) covering the gate isolation layer 80 and the doped polysilicon sidewall 70, and a metal layer 100 of, e.g., tungsten (W) is filled and thickly deposited thereon. A CMP process is performed to thereby form the gate electrode.

A local channel ion implantation is performed only in case a source and a drain region are salicidated or a lightly doped drain (LDD) implantation is performed before the gate isolation layer 80 is deposited.

In one example, the doped poly silicon sidewall 70 may be used to function as the LDD implantation without forming the LDD implantation. In other words, when a power is applied to the gate electrode, the pad oxide layer 30 under the doped poly silicon sidewall 70 may serve as an LDD doping role by controlling the thickness of the pad oxide layer 30 under the doped poly silicon sidewall 70 because the pad oxide layer 30 under the doped poly silicon sidewall 70 is thicker than the gate isolation layer 80.

Figure 1D:
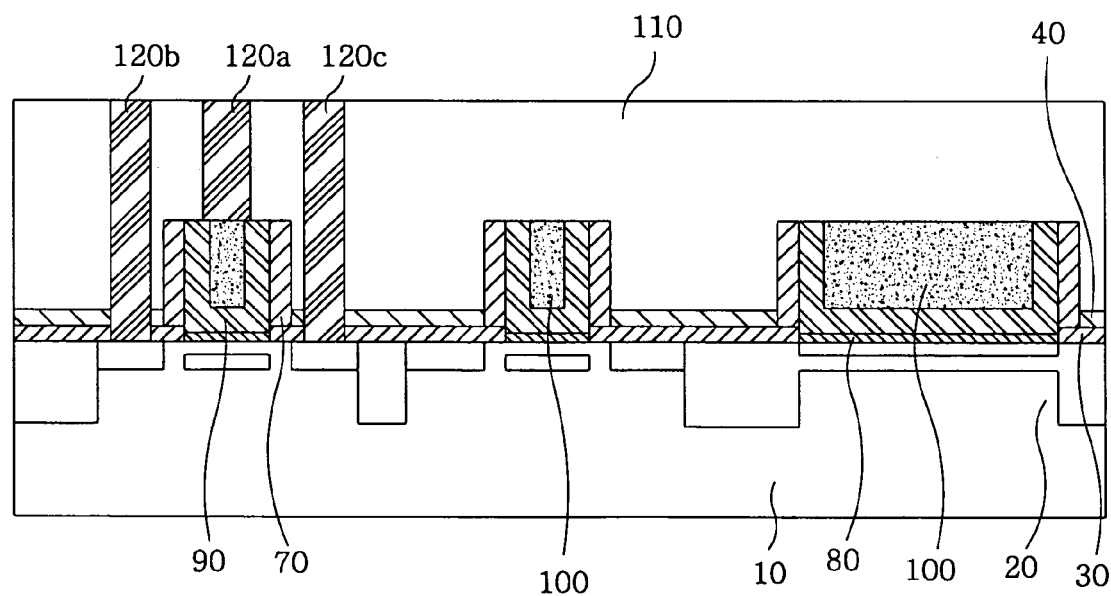

Referring to FIG. 1D, the first oxide layer 50 is removed using a wet etching or a dry etching, and a source and a drain are formed by an ion implantation. Thereafter, a first insulation layer 10 is thickly deposited and then planarized using a CMP. Finally, a gate plug 120A, a source plug 120b and a drain plug 120c are formed.

In accordance one example, the gate having a fine pattern can be formed by using the doped poly silicon sidewall 70 for use in controlling the channel length of the gate so that it can be obtained a new method capable of enhancing an operating characteristic of a transistor and reducing a cost of a lithography tool. Also, the thickness of the pad oxide layer 30 under the doped poly silicon sidewall 70 can be controlled so that the LDD implantation may be substituted with the pad oxide layer 30 under the doped poly silicon sidewall 70.

Although certain methods and apparatus have been described herein, the scope of coverage of this patent is not limited thereto. To the contrary, this patent covers all embodiments fairly falling within the scope of the appended claims either literally or under the doctrine of equivalents.

What is claimed is:

1. A method for fabricating a transistor in a semiconductor device, comprising:

forming an isolation region in a semiconductor substrate and sequentially depositing a pad oxide layer, a pad nitride layer and a first oxide layer on the substrate and the isolation region;

pattering the first oxide layer and pad nitride layer to form a gate electrode opening;

depositing a doped poly silicon layer over the whole semiconductor substrate including the opening;

etching back the doped poly silicon layer until the pad oxide layer is exposed to form a doped polysilicon sidewall in contact with a sidewall of the pad nitride layer and the first oxide layer, wherein the doped polysilicon sidewall is used to serve as the lightly doped drain (LDD) implantation;

etching the pad oxide layer exposed by the doped polysilicon sidewall to expose the semiconductor substrate;

forming a gate isolation layer thinner than the thickness of the pad oxide layer and in contact with the pad oxide layer on the exposed semiconductor substrate;

sequentially depositing and planarizing a gate nitride layer covering the gate isolation layer and the doped polysilicon sidewall, and a metal layer on the whole substrate to form the gate electrode; and forming a source, a drain, a gate plug, a source plug and a drain plug, respectively.

2. The method of claim 1, wherein the isolation region is shallow trench isolation(STI).

3. The method of claim 1, wherein a thickness of the pad oxide layer is not less than 50 angstrom.

4. The method of claim 1, wherein the gate nitride layer is made of at least one of TiN and TaN.

5. The method of claim 1, wherein the metal layer is made of tungsten (W).

6. The method of claim 2, wherein the thickness of the pad oxide layer under the doped poly silicon sidewall is controlled to be used to serve as the LDD implantation.

* * * * *